(12) United States Patent
Niiro

(10) Patent No.: US 6,785,858 B2
(45) Date of Patent: Aug. 31, 2004

(54) SEMICONDUCTOR DEVICE CAPABLE OF ADJUSTING TIMING OF INPUT WAVEFORM BY TESTER WITH HIGH ACCURACY

(75) Inventor: Mitsutaka Niiro, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 697 days.

(21) Appl. No.: 09/774,700

(22) Filed: Feb. 1, 2001

(65) Prior Publication Data

US 2002/0026613 A1 Feb. 28, 2002

(30) Foreign Application Priority Data

Aug. 28, 2000 (JP) .................................... 2000-257745

(51) Int. Cl.⁷ ........................................ G01R 31/3177
(52) U.S. Cl. ..................... 714/744; 714/731; 324/533
(58) Field of Search ................................. 324/532, 533, 324/527; 714/731, 744

(56) References Cited

U.S. PATENT DOCUMENTS

| | | | | |
|---|---|---|---|---|
| 4,766,386 A | * | 8/1988 | Oliver et al. | 324/533 |
| 5,521,512 A | * | 5/1996 | Hulina | 324/533 |
| 6,177,801 B1 | * | 1/2001 | Chong | 324/520 |
| 6,609,077 B1 | * | 8/2003 | Brown et al. | 702/117 |
| 6,675,117 B2 | * | 1/2004 | Adam et al. | 702/106 |
| 2002/0049554 A1 | * | 4/2002 | Miller | 702/104 |

FOREIGN PATENT DOCUMENTS

JP          6-148279          5/1994

OTHER PUBLICATIONS

Pointl, P., Interfacing, often a performance bottleneck between ATE and device under test, European Test Conference, 1989., Proceedings of the 1st, vol. Iss., Apr. 12–14, 1989□□pp. 94–99.*

* cited by examiner

Primary Examiner—R. Stephen Dildine
(74) Attorney, Agent, or Firm—McDermott, Will & Emery

(57) ABSTRACT

A timing adjusting circuit is mounted on a semiconductor device. A reference signal TREFIN and signals TPa to TPx to be adjusted are supplied from a tester via transmission lines on a test jig. By gradually advancing phases of the signals TPa to TPx with respect to a trigger signal TRIG generated on the basis of the reference signal, the differences of transition timings of driver waveforms are held in a plurality of registers corresponding to the transmission lines. The data held by the plurality of registers is sent to the tester via a storage result outputting circuit. On the basis of the data, output timings of the driver waveforms can be adjusted by the tester with high accuracy.

10 Claims, 16 Drawing Sheets

図15

TIMING ERROR (Δa) AT END
OF TRANSMISSION LINE

LIMIT OF CORRECTION
ACCURACY OF TESTER (Δb)

SEMICONDUCTOR DEVICE CAPABLE OF ADJUSTING TIMING OF INPUT WAVEFORM BY TESTER WITH HIGH ACCURACY

BACKGROUND OF THE INVENTION

1. Field of the Invention

The present invention relates to a semiconductor device and, more particularly, a semiconductor device which can be measured while correcting signal propagation delay time in a wire on a test jig interposing between a semiconductor tester and the semiconductor device and a timing error between propagation delay time in wires.

2. Description of the Background Art

In the case of measuring electric characteristics and the like of a semiconductor device by a semiconductor tester (hereinbelow, called a tester), usually, a jig for interface (hereinbelow, called a test jig) is interposed to electrically connect the tester and the semiconductor device. Since the tester is a large and expensive facility, it is commonly used for a plurality of kinds of semiconductor devices in a semiconductor device manufacturing factory. The number of terminals and the shape of a package vary according to semiconductor devices. By replacing a test jig with another, different kinds of semiconductor devices can be measured by the same tester.

FIG. 14 is a diagram for explaining the test jig.

Referring to FIG. 14, a tester 200 has drivers 204a to 204x for outputting waveforms to a plurality of connection terminals, and comparators 206a to 206x for measuring waveforms of the terminals.

A test jig 202 includes a socket 212 for attaching a semiconductor device and transmission lines 208a to 208x for connecting a plurality of terminals of the socket 212 to the different connection terminals of the tester 200. As the transmission lines 208a to 208x, for example, coaxial lines 210 are used.

FIG. 15 is a diagram showing a state where a semiconductor device is attached to the socket of the test jig.

Referring to FIG. 15, when the semiconductor device is attached to the socket 212, the transmission lines 208a to 208x are electrically connected to terminals of the semiconductor device.

For example, in the case of measuring time (such as access time) between receipt of a signal from the tester and outputting of any signal by the semiconductor device, it is known that the excess time has to be subtracted from the time measured as access time. The excess time is obtained by adding the time required for a signal outputted from the tester 200 to reach the semiconductor device via the transmission lines 208a to 208x on the test jig 202 and the time required for the signal outputted from the semiconductor device to reach the tester 200 via the signal transmission lines 208a to 208x.

That is, the delay time caused by the signal transmission lines 208a to 208x existing on the test jig 202 has to be especially considered and excluded. Usually, coaxial cables or wiring patterns formed on a printed wiring board are used as the transmission lines 208a to 208x. Due to the wiring length, generally, signal propagation delay time of the order of a few ns occurs.

Conventionally, a method called TDR (Time Domain Reflectmetry) which preliminarily measures the signal propagation delay time on the test jig by a tester is used. Then, another method of subtracting the preliminarily measured propagation delay time at the time of measuring electric characteristics of a semiconductor device is used.

FIG. 16 is a diagram for explaining measurement of propagation delay time by the TDR method.

FIG. 17 is a waveform chart at the time of measuring the propagation delay time by the TDR method.

Referring to FIGS. 16 and 17, in order to measure time T_cable of propagation of a signal through the transmission line 208a, a signal wave is outputted from the driver 204a of the tester in a state where the semiconductor device is not attached to the socket of the test jig, that is, an output end 214 of the transmission line 208a is open.

The signal wave outputted from the driver 204a passes through the transmission line 208. The signal wave is totally reflected by the output terminal 214 which is open. The signal wave passes through the transmission line 208a again, and is received by the comparator 206a of the tester. The total time is measured by the tester. The measured time is time required for the signal wave to go and return through the transmission line 208a and is twice as long as the propagation time T_cable. The time which is the half of the measured time is defined as propagation delay time in the transmission line 208a.

FIG. 18 is a diagram showing the correspondence between the transmission lines on the test jig and propagation delay time.

Referring to FIG. 18, propagation delay time in the transmission lines 208a, 208b, 208c, . . . , 208x is set as T_cable-a, T_cable-b, T_cable-c, . . . , T_cable-x, respectively. Due to error factors such as variations in wiring length and mounting conditions (such as soldering) of the socket, the signal propagation delay time T_cable-a to T_cable-x in the transmission lines 208a to 208x extending from the tester to the socket varies.

FIG. 19 is a waveform chart showing a state where the waveform outputted from the tester propagates to the output end of each of the transmission lines.

Referring to FIG. 19, it is assumed that waveforms observed at the output ends of the transmission lines 208a to 208x are waveforms W208a to W208x, respectively. Propagation delay time in all the signal transmission lines 208a to 208x is measured in advance. At the time of measuring the electric characteristics of a semiconductor device or the like, measurement is performed by supplying a signal to the semiconductor device at a timing obtained by subtracting the measured propagation delay time T_cable-a to T_cable-x in the transmission lines 208a to 208x.

In such a manner, although a timing error in the propagation time of Δa occurs at the ends of the socket before correction of the propagation delay time by the TDR method, the timing error can be shortened. The measured propagation delay time T_cable-a to T_cable-x is recorded as data for correction in the tester. The tester adjusts the timing of making the driver output data with reference to the correction data.

FIG. 20 is a waveform chart showing waveforms at the output ends after correction by the tester.

Referring to FIGS. 19 and 20, before correction of the propagation delay time by the TDR method, there is a timing error Δa in the propagation delay time between the transmission lines 208a to 208x at the ends of the socket. By performing the timing correction, the timing error Δa can be shortened to about Δb. Consequently, the correction can be made so that a semiconductor device can receive substantially (actually) simultaneously output signals at a timing, which are outputted from the tester.

In recent years, as the operating frequency increases, as seen in a DDR SDRAM (Double Data Rate Synchronous Dynamic Random Access Memory) or the like, there occurs a necessity to measure a semiconductor device which is requested to have a very small error between a data output timing reference signal and a data output timing.

The measuring accuracy has to be therefore further improved. As described above, in order to improve the accuracy of measuring a semiconductor device by a tester, it is necessary to measure the semiconductor device after accurately correcting the signal propagation delay time on the test jig, a timing error caused by variations in wiring length among the transmission lines, and the like.

Referring again to FIG. 16, in the method using the conventional TDR method, when the propagation delay time of, for example, the transmission line 208a is measured, since the timing accuracy of both the driver 204a and the comparator 206a is involved, the timing correction is limited. The timing error between the plurality of transmission lines (hereinbelow, called a skew among pins) is a value of, for example, about ±several hundreds ps. A nominal value of the value is shown under the name such as a driver skew or the like in the tester.

In the case of a semiconductor device requiring a high accuracy timing condition (for example, an error of ±100 ps or less) such as a DDR SDRAM described above, there is a problem such that measurement cannot be done due to the limitation of the timing correction.

SUMMARY OF THE INVENTION

An object of the invention is to provide a semiconductor device which can be measured while accurately correcting a timing error by a test jig.

In short, the invention relates to a semiconductor device having a reference terminal, a plurality of terminals, a capturing circuit, a data holding circuit, and an output circuit.

The reference terminal receives a reference signal. The capturing circuit captures an input signal supplied to the plurality of terminals in accordance with the reference signal and temporarily holds the input signal. The data holding circuit receives the data held by the capturing circuit and holds data of an amount corresponding to a predetermined number of capturing times. The output circuit outputs the data held by the data holding circuit to the outside.

According to another aspect of the invention, there is provided a semiconductor device testing method of testing a semiconductor device by a tester via a test jig, including the steps of: attaching a semiconductor device to the test jig; supplying the reference signal and the input signal from the tester and allowing the data holding circuit to hold delay amount data of each of a plurality of signal transmission lines of the test jig corresponding to the plurality of terminals; reading the delay amount data by the tester via the test jig; and correcting a timing of a signal which is outputted to the plurality of terminals by the tester in accordance with the delay amount data.

The semiconductor device includes: a reference terminal for receiving a reference terminal; a plurality of terminals; and a data holding circuit for holding data corresponding to a time difference between the reference signal and an input signal supplied to the plurality of terminals.

Consequently, a main advantage of the present invention is that, since the timing of the tester is corrected so as to be adapted to the test jig with high accuracy, even a semiconductor device having a strict specification of a skew between pins can be also measured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a diagram showing outputs of the capture memory 54a, which is held in a register 56a;

DESCRIPTION OF THE PREFERRED EMBODIMENTS

Figure 1:
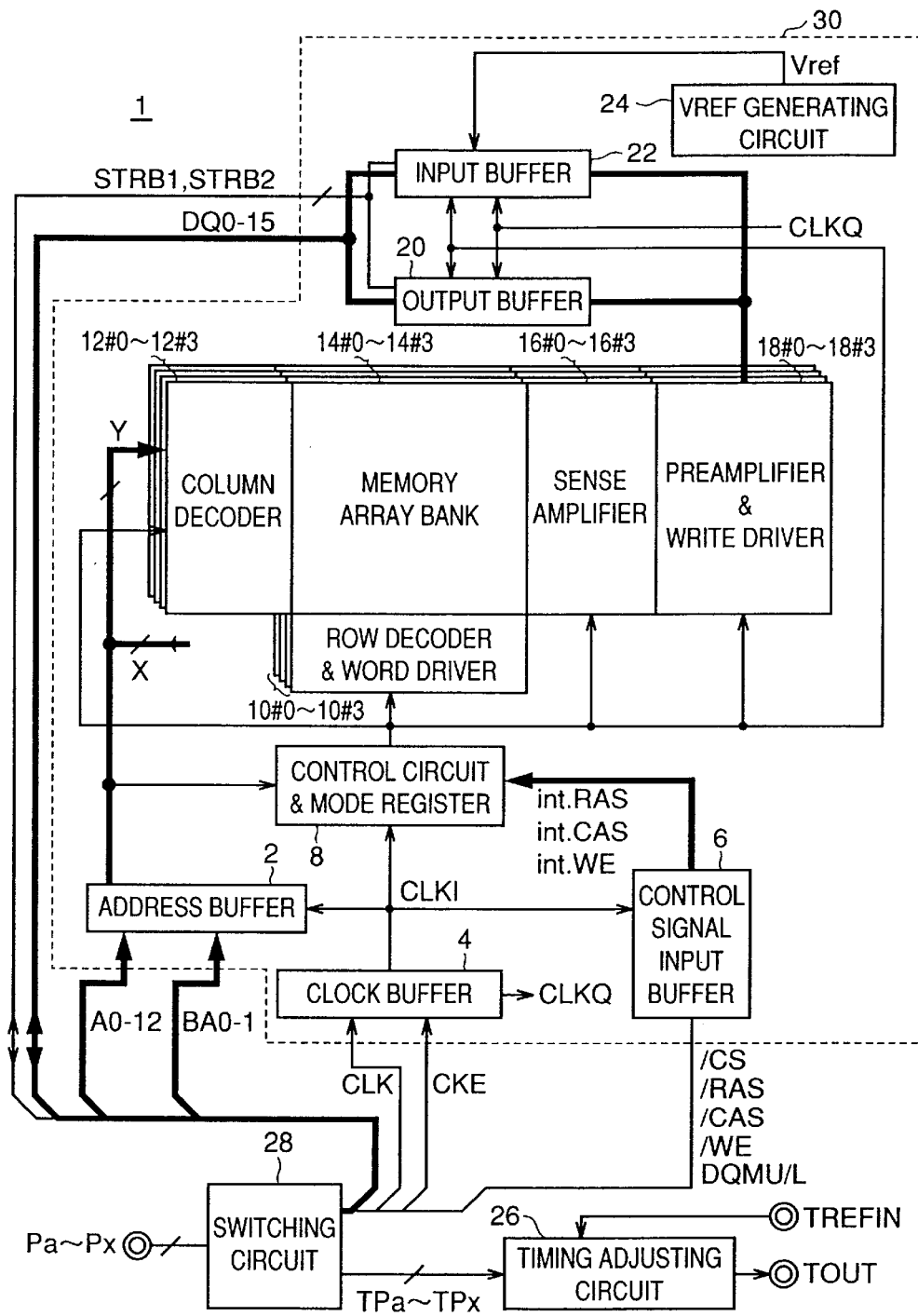
FIG. 1 is a schematic block diagram showing the configuration of a semiconductor device 1 according to a first embodiment of the invention.

Embodiments of the invention will be described in detail hereinbelow with reference to the drawings. The same reference numerals in the drawings are designated to the same or corresponding components.

First Embodiment

FIG. 1 is a schematic block diagram showing the configuration of a semiconductor device 1 according to a first embodiment of the invention.

Referring to FIG. 1, the semiconductor device 1 includes: a switching circuit 28 for connecting each of terminals Pa to Px to one of outputs of two systems; an internal circuit 30 which receives control signals /CS, /RAS, /CAS, /WE, and DQMU/L, a clock signal CLK, a clock enable signal CKE, address signals A0 to A12 and BA0 and BA1, data input/output signals DQ0 to DQ15, and strobe signals STRB1 and STRB2 from a first output system of the switching circuit 28 and operates; and a timing adjusting circuit 26 which outputs a test output signal TOUT in accordance with signals TPa to TPx from a second output system of the switching circuit 28 and a reference signal TREFIN.

The internal circuit 30 is, although not especially limited, a memory circuit in the embodiment.

The internal circuit 30 includes: memory array banks 14#0 to 14#3 each having a plurality of memory cells arranged in an array; an address buffer 2 which captures the address signals A0 to A12 and BA0 and BA1 synchronously with the clock signal CLKI and outputs an internal row address, an internal column address, and an internal bank address; a clock buffer 4 which receives the clock signal CLK and the clock enable signal CKE and outputs the clock signals CLKI and CLKQ used in the memory circuit; and a control signal input buffer 6 which captures the control signals /CS, /RAS, /CAS, /WE, and DQMU/L synchronously with the clock signal CLKI.

The internal circuit 30 further includes: a control circuit which receives an internal address signal from the address buffer 2 and control signals int.RAS, int.CAS, and int.WE synchronized with the clock signal from the control signal input buffer 6 and outputs the control signals to respective blocks synchronously with the clock signal CLKI; and a mode resistor for holding an operation mode recognized by the control circuit. In FIG. 1, the control circuit and the mode register are shown in a block 8.

The control circuit includes: a bank address decoder for decoding internal bank address signals int.BA0 and int.BA1; and a command decoder for receiving and decoding the control signals int.RAS, int.CAS, and int.WE.

The internal circuit 30 further includes: row decoders which are provided in correspondence with the memory array banks 14#0 to 14#3 and decode a row address signal X supplied from the address buffer 2; and word drivers each for driving a row (word line) into a selected state, the row being designated by the address in the memory array banks 14#0 to 14#3 in accordance with an output signal of the row decoders. In FIG. 1, the row decoders and the word drivers are shown as blocks 10#0 to 10#3.

The internal circuit 30 further includes: column decoders 12#0 to 12#3 which decode internal column address signals Y supplied from the address buffer 2 and generate column selection signals; and sense amplifiers 16#0 to 16#3 which sense and amplify data of memory cells connected to selected rows in the memory array banks 14#0 to 14#3.

The internal circuit 30 further includes: an input buffer 22 for receiving write data from the outside and generating internal write data; write drivers for amplifying the internal write data from the input buffer 22 and transmitting the resultant data to a selected memory cell; preamplifiers for amplifying data read from the selected memory cell; and an output buffer 20 for buffering the data from the preamplifier and outputting the resultant data.

The preamplifiers and the write drivers are provided in correspondence with the memory array banks 14#0 to 14#3. In FIG. 1, the preamplifiers and the write drivers are shown as blocks 18#0 to 18#3.

The input buffer 22 captures the data DQ0 to DQ15 which are supplied from the outside to the terminal in accordance with the strobe signals STRB1 and STRB2 which are complementary to each other. Each of the strobe signals STRB1 and STRB2 is a signal outputted from another semiconductor device or the like which outputs data to the internal circuit 30 synchronously with the data and is a signal used as a reference of time of capturing data. The internal circuit 30 receives the strobe signals STRB1 and STRB2 which are transmitted in parallel with the data and are supplied to the two nodes and uses the strobe signals STRB1 and STRB2 as a reference of capturing a data signal.

The internal circuit 30 further includes a Vref generating circuit 24 for generating a set potential Vref. The set potential Vref is supplied to the input buffer and is used as a reference of a threshold at the time of capturing data.

When the internal circuit 30 outputs data to the outside, the output buffer 20 outputs the data DQ0 to DQ15 synchronously with the clock signal CLKQ, and outputs the strobe signals STRB1 and STRB2 to the outside, which are used for another semiconductor device to capture the data signal.

Figure 2:
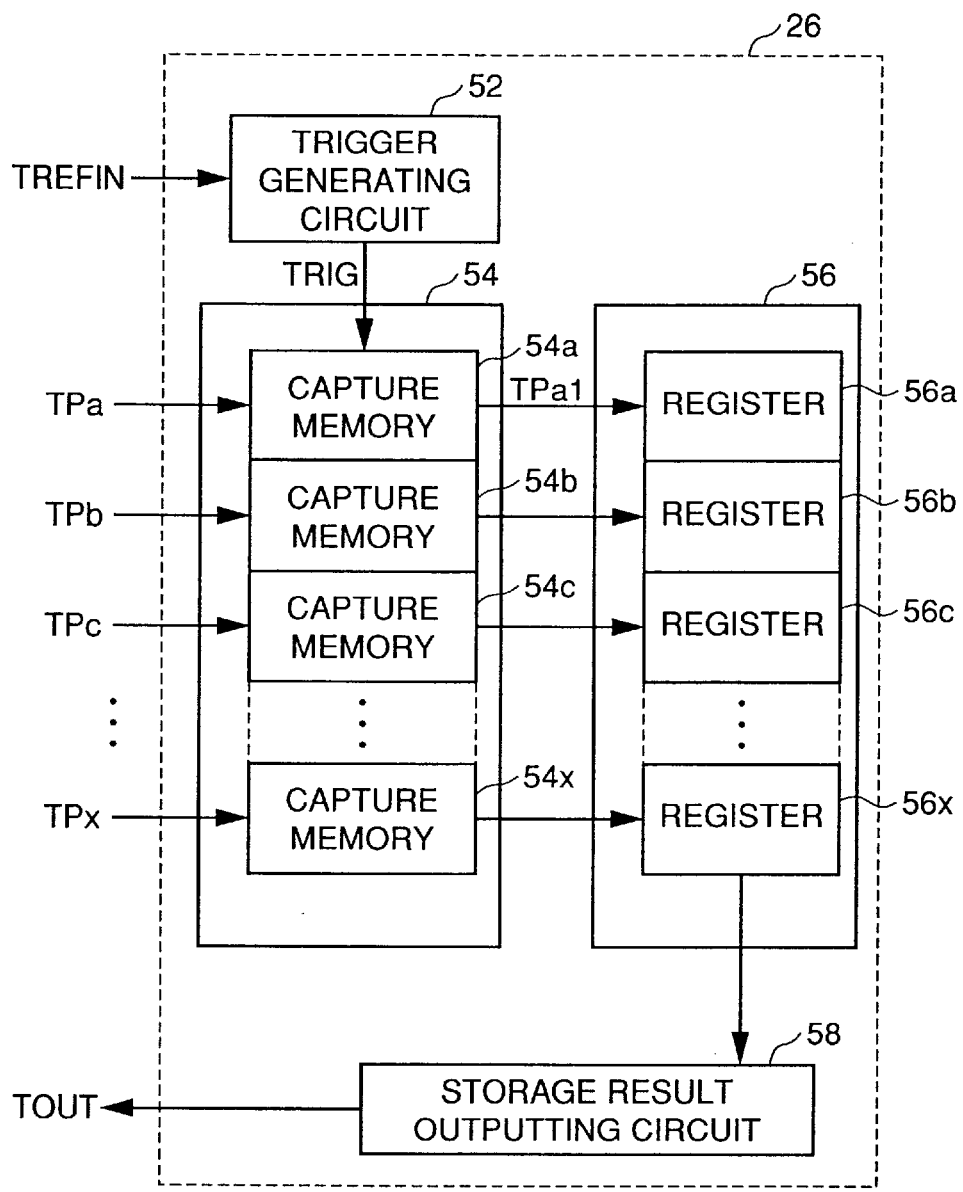
FIG. 2 is a block diagram showing the configuration of a timing adjusting circuit 26 in FIG. 1.

FIG. 2 is a block diagram showing the configuration of the timing adjusting circuit 26 in FIG. 1.

Referring to FIG. 2, the timing adjusting circuit 26 includes: a trigger generating circuit 52 which receives the reference signal TREFIN and outputs a trigger signal TRIG; a capture circuit 54 for capturing the signals TPa to TPx in accordance with the trigger signal TRIG; a propagation delay time data storing circuit 56 which sequentially receives outputs of the capture circuit 54 and holds outputs of a predetermined number of times; and a storage result outputting circuit 58 which receives an output of the propagation delay time data storing circuit 56 and outputs a test output signal TOUT to an external test output pin.

FIG. 2 shows a case where the storage result outputting circuit 58 sequentially outputs delay amount data of a plurality of terminals to the dedicated test output pin. However, after capturing the delay amount data, it is unnecessary to receive an input signal. The delay amount data can be therefore outputted in parallel to each of the terminals in the opposite routes of the signals TPa to TPx. The tester has drivers for outputting waveforms to the connection pins and comparators for reading the level of the supplied waveforms, so that the delay amount data can be read. In this case, it is sufficient to include a switching circuit in the configuration of the storage result outputting circuit 58 and supply the outputs of the registers 56a to 56x to the paths through which the signals TPa to TPx are supplied.

The capture circuit 54 includes capture memories 54a to 54x for capturing the signals TPa to TPx in accordance with the trigger signal TRIG.

The propagation delay time data storing circuit 56 includes registers 56a to 56x for holding only a predetermined number of outputs of the capture memories 54a to 54x.

Figure 3:
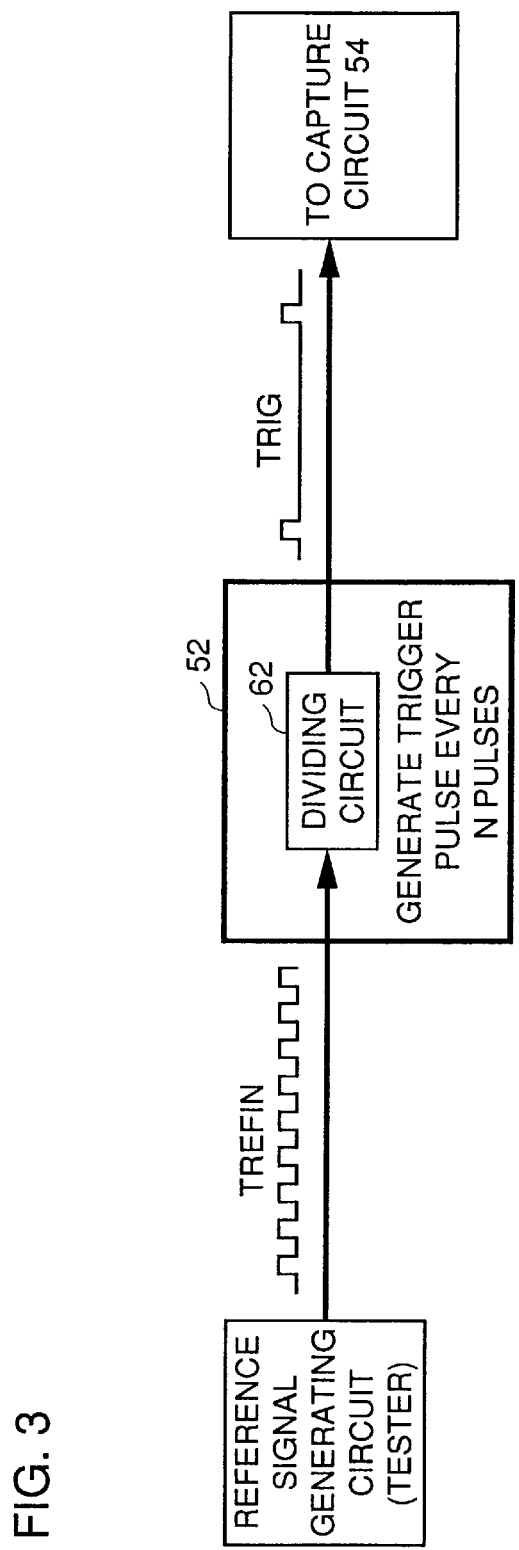
FIG. 3 is a diagram for explaining a trigger generating circuit 52.

FIG. 3 is a diagram for explaining the trigger generating circuit 52.

Referring to FIG. 3, the trigger generating circuit 52 includes a dividing circuit 62 which receives the reference signal TREFIN outputted from a reference signal generating circuit provided in the tester and generates a trigger pulse every (n) pulses (n is a predetermined natural number). The trigger signal TRIG outputted from the dividing circuit 62 is outputted to the capture circuit 54. When a PLL (Phase Locked Loop) circuit or a DLL (Delay Locked Loop) circuit is used in place of the dividing circuit 62, the accuracy of the timing adjustment can be further improved.

Figure 4:
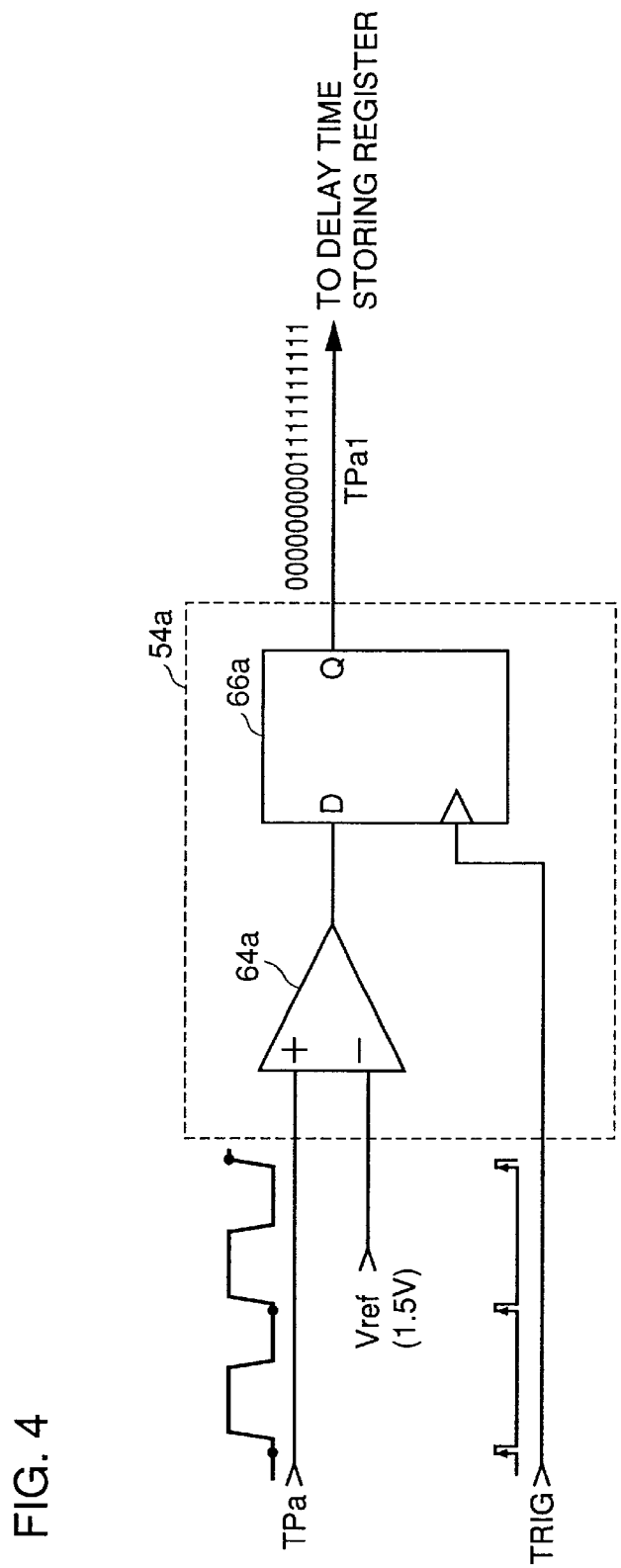
FIG. 4 is a circuit diagram showing the configuration of a capture memory 54a in FIG. 2.

FIG. 4 is a circuit diagram showing the configuration of the capture memory 54a in FIG. 2.

The capture memory 54a includes: a comparing circuit 64a for comparing the signal TPa supplied from the driver of the tester with a predetermined set potential Vref; and a flip flop 66a for capturing an output of the comparing circuit 64a in accordance with the trigger signal TRIG and holding the output. The signal TPa1 is outputted from the flip flop 66a to the delay time storage register. For example, when the amplitude of the signal TPa supplied from the driver in the tester is 0V to 3V, the set potential Vref is set to 1.5V.

Figure 5:
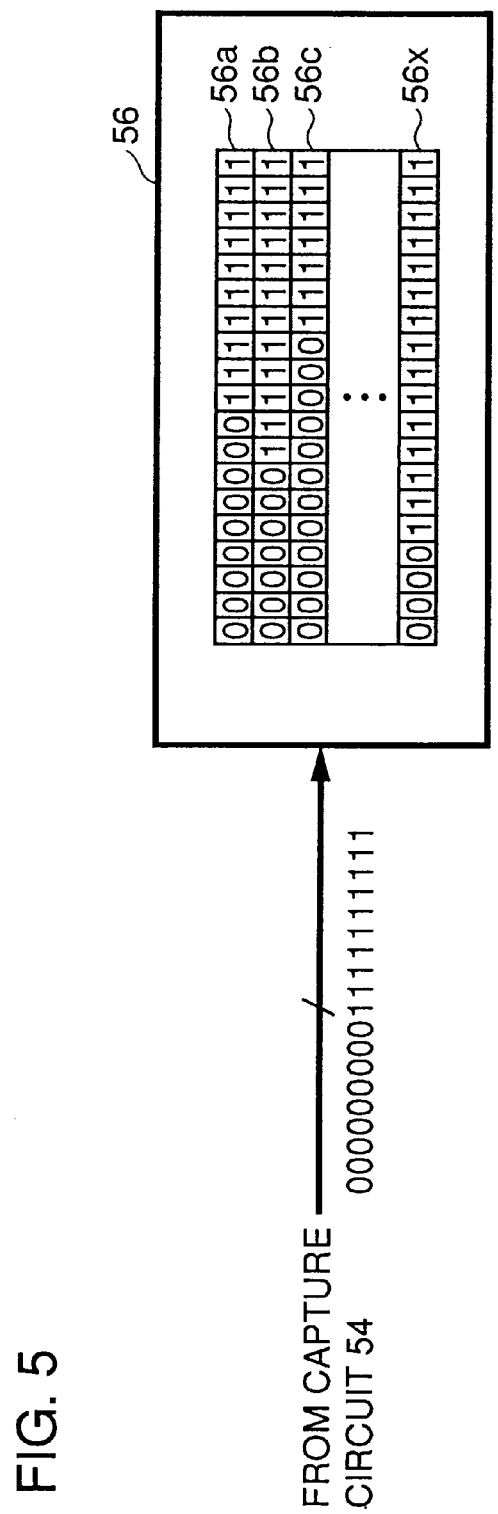
FIG. 5 is a conceptual diagram showing the configuration of a propagation delay time data storing circuit 56 in FIG. 2.

FIG. 5 is a conceptual diagram showing the configuration of the propagation delay time data storing circuit 56 in FIG. 2.

Referring to FIG. 5, the propagation delay time data storing circuit 56 includes registers 56a to 56x for holding outputs of the capture memories 54a to 54x in FIG. 2, respectively. Each of the registers 56a to 56x can hold a predetermined number of binary data.

Figure 6:
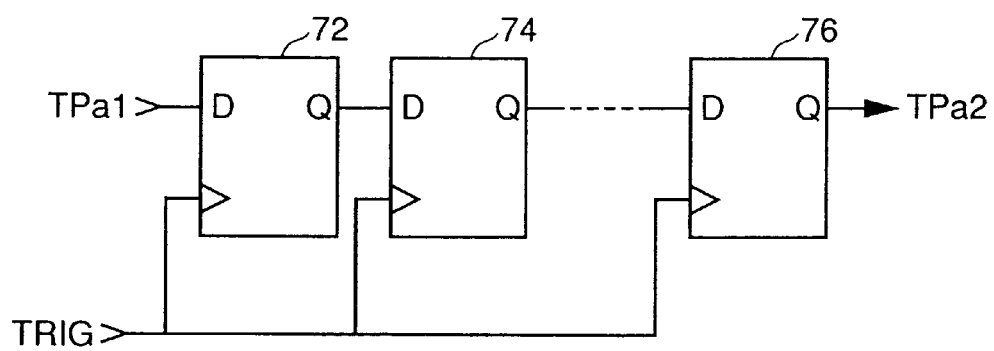
FIG. 6 is a circuit diagram showing a specific configuration example of a register 56a in FIG. 2.

FIG. 6 is a circuit diagram showing a specific example of the configuration of the register 56a in FIG. 2.

Referring to FIG. 6, the register 56a includes flip flops 72 to 76 which are connected in series, receive the signal TPa1, and sequentially transfer the data in accordance with the trigger signal TRIG. The flip flops 72 to 76 construct a shift register for shifting data one by one when pulses are supplied in response to the trigger signal TRIG.

In place of the configuration shown in FIG. 6, a first-in first-out (FIFO) memory may be used. A combination of a memory circuit controlled by a regular address and a control circuit for generating an address so that data is sequentially written/read into/from a memory area may be also used.

A tester for measuring the semiconductor device 1 of the invention will now be described.

Figure 7:
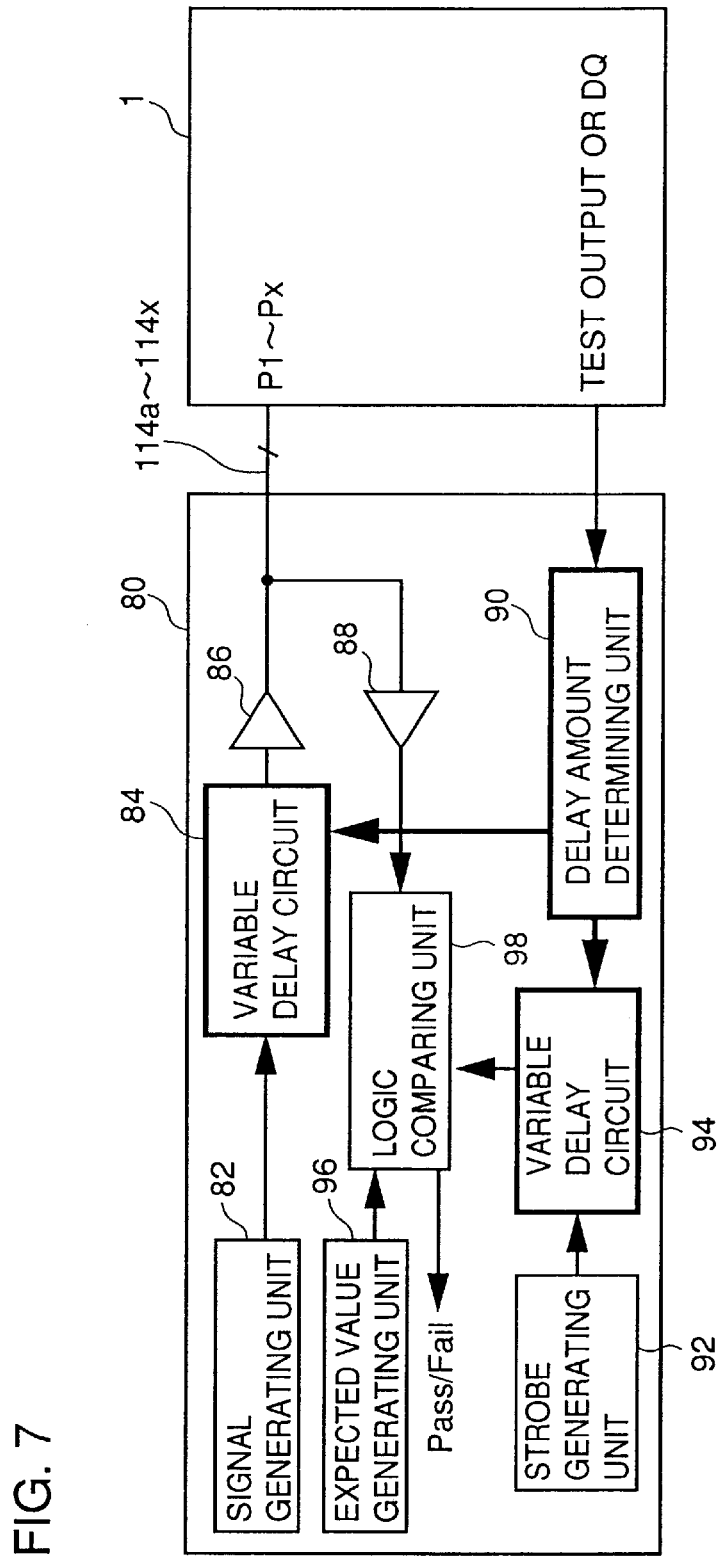
FIG. 7 is a simple block diagram for explaining the configuration of a tester.

FIG. 7 is a schematic block diagram for explaining the configuration of the tester.

Referring to FIG. 7, a tester 80 includes: a signal generating unit 82 for generating waveforms; a variable delay circuit 84 which receives an output of the signal generating unit 82 and corrects propagation delay time and the like for every pin; and a driver 86 for supplying the waveform to the semiconductor device 1 at a timing corrected by the variable delay circuit 84.

The tester 80 further includes: a comparator 88 which receives the waveform outputted from the semiconductor device 1; an expected value generating unit 96 for generating an expected value in accordance with a test pattern; a strobe generating unit 92 for generating a timing of comparing the expected value; a variable delay circuit 94 for adjusting propagation delay time of each pin; and a logic comparing unit 98 for comparing an output of the comparator 88 with an output of the expected value generating unit 96 in accordance with the timing outputted from the variable delay circuit 94 to thereby determine "pass" or "fail". As will be described hereinlater, from normal terminals such as a test output of the semiconductor device 1 and the data terminal DQ which is switched and used, data corresponding to a delay amount of each pin is outputted. The tester 80 receives the data, determines delay time to be adjusted by a delay amount determining unit 90, and instructs a delay amount to the variable delay circuits 84 and 94.

According to the conventional TDR method, delay time is measured via the comparator 88 for every pin, and data corresponding to the delay time is held as a data file in the delay amount determining unit 90. In the case of the invention, the data of the delay amount stored in the semiconductor device 1 is transferred to the delay amount determining unit 90, a data file is created on the basis of the data, and is held.

Figure 8:
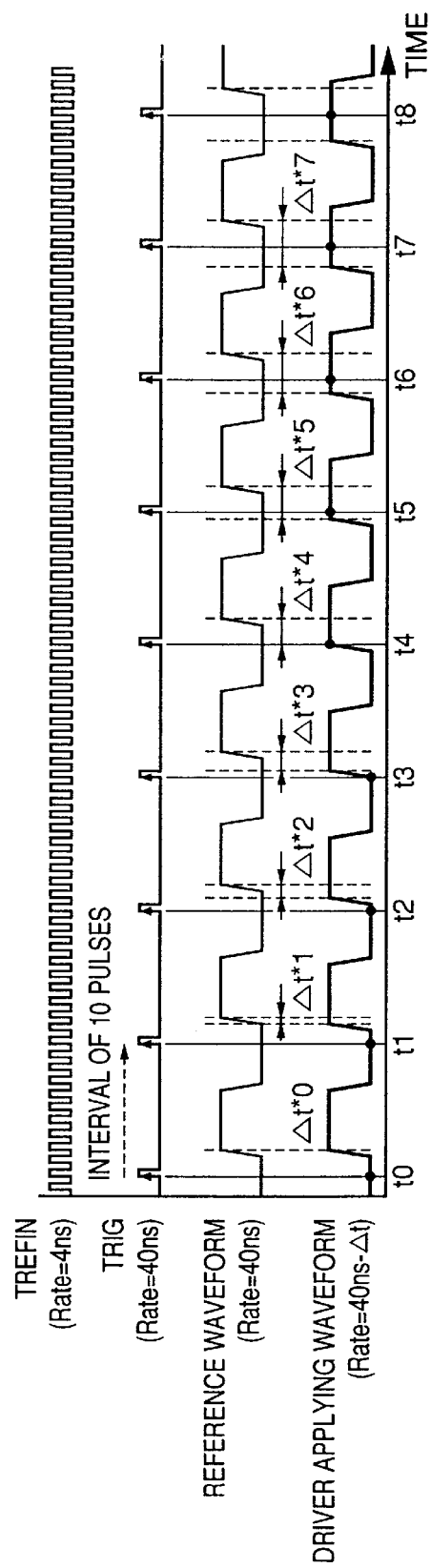
FIG. 8 is a waveform chart for explaining operations of obtaining delay amount data of each of terminals.

FIG. 8 is a waveform chart for explaining operations for obtaining delay amount data of each terminal.

Referring to FIG. 8, the reference signal TREFIN having a rate of 4 ns is supplied to the trigger generating circuit 52 in FIG. 2 so that a trigger is allowed to be generated every predetermined number of pulses. In FIG. 8, as the trigger signal TRIG, a pulse is outputted every 40 ns, which is at a rate of one pulse every 10 pulses of the reference signal TREFIN.

By using the reference signal TREFIN as a reference, the timing of the signal output from the driver 86 in FIG. 7 is adjusted. The reference signal TREFIN is supplied to a predetermined reference terminal in the semiconductor device 1. The reference terminal may be any one of the terminals Pa to Px. Then, data is supplied from the driver 86 to other terminals. The data arrives at the terminal section of the semiconductor device 1. Adjustment is performed, utilizing the reference time during which the reference signal arrives at the reference terminal, such that the signals arrive at respective terminals at the same timing.

Meanwhile, a waveform applied from the driver to a terminal except for the terminal to which the reference signal TREFIN is supplied will be described. For simplicity of explanation, FIG. 8 shows reference waveforms of which phases are always equal to those of the trigger signal TRIG.

In time t0 to t1, the reference waveform and the driver applying waveform coincide with each other.

Subsequently, in time t1 to t2, the change point of the driver applying waveform occurs faster than that of the reference waveform only by a timing setting resolution Δt of the tester.

The timing setting resolution of the tester will now be briefly described. The amount of the minimum unit capable of setting the timing at which the driver 86 in FIG. 7 outputs a waveform is called a timing setting resolution. The timing setting resolution is much higher as compared with the rate of the waveforms which can be outputted from the tester. For example, the timing setting resolution is about a several hundredths of the rate of the waveforms. In the case of a tester having the rate of waveforms which can be outputted of 4 ns, the resolution is, for example, 16 ps.

In time from t2 to t3, the driver applying waveform advances with respect to the reference waveform only by an amount which is twice as long as Δt. From then on, each time the trigger signal TRIG is supplied, the driver applying waveform advances by Δt with respect to the reference waveform.

By capturing the driver waveform at, for example, the rising edge of the trigger signal TRIG in a state where the waveforms are supplied in such a manner, as will be described hereinlater, the propagation delay time of each of the transmission lines can be monitored.

Figure 9:
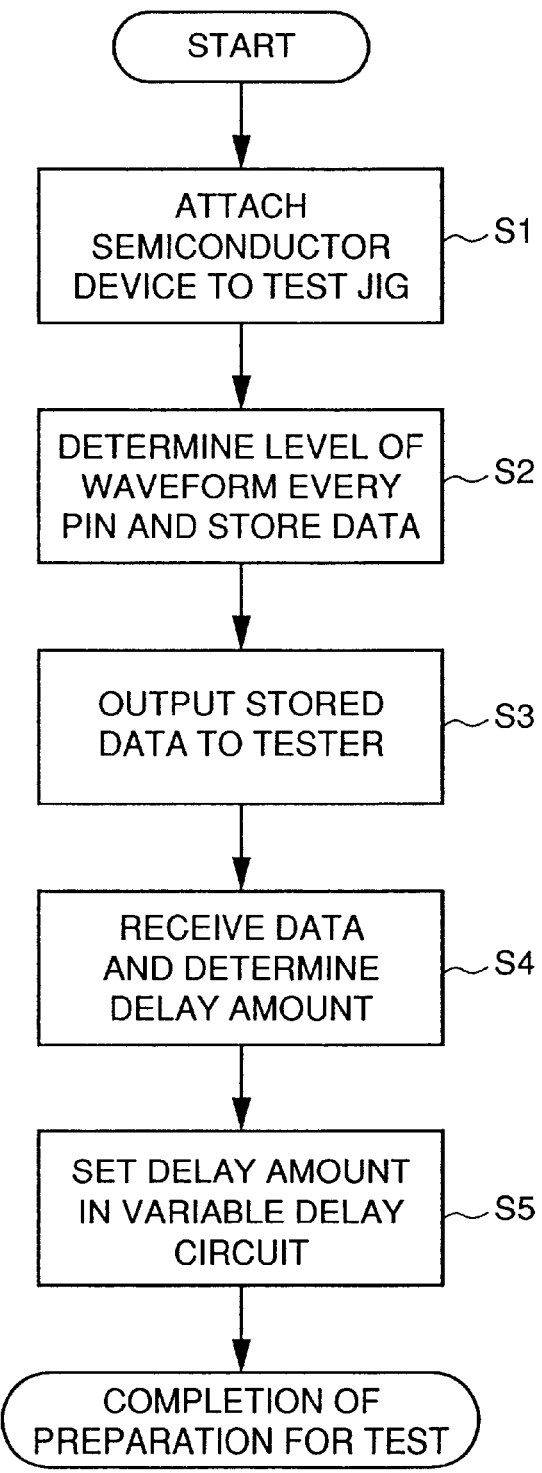
FIG. 9 is a flowchart showing the flow of performing timing adjustment by using the semiconductor device of the invention.

FIG. 9 is a flowchart showing the flow of adjusting the timing by using the semiconductor device of the invention.

Referring to FIG. 9, on start of a test of the semiconductor device in step S1, the semiconductor device is attached to the test jig to adjust timings on the transmission lines on the test jig. In step S2, a reference signal from the tester and an input waveform from the driver are supplied to the semiconductor device. In the semiconductor device, the level of the waveform is determined every pin and delay amount data is stored.

The determination of the level of the waveform will be briefly described here.

Figure 10:
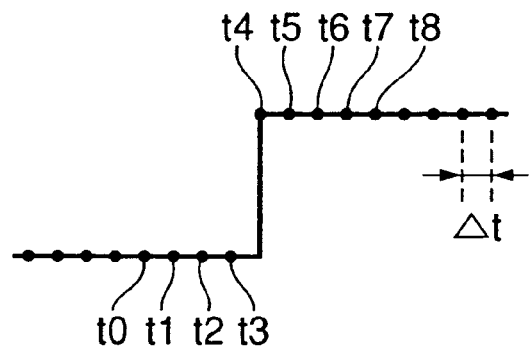
FIG. 10 is a diagram for explaining determination of a level of a waveform.

FIG. 10 is a diagram for explaining the determination of the level of the waveform.

Referring to FIGS. 8 and 10, the driver applying waveform is sampled by the capture memory 54a in FIG. 2 at each of time T0 to T8. As a result, a waveform as shown in FIG. 10 is obtained by capturing the driver waveforms at time intervals of the resolution $\Delta t$.

Figure 11:
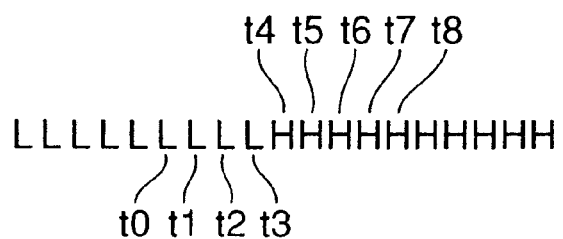
FIG. 11 is a diagram showing data outputted from the capture memory 54a in correspondence with FIG. 10.

FIG. 11 is a diagram showing data outputted from the capture memory 54a in correspondence with FIG. 10.

Figure 12:
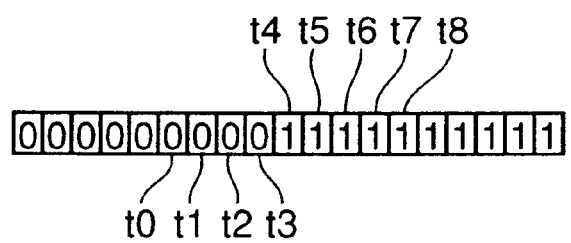

FIG. 12 is a diagram showing outputs of the capture memory 54a held in the register 56a.

From FIGS. 10 to 12, it is shown that a data transition point exists in a period between time t3 and time t4.

In practice, "H" or "L" is captured every trigger point so that the level of "H" or "L" is determined by using a certain voltage level (for example, 1.5V in the case of FIG. 4) as a reference. The process is performed every driver applying waveform of the transmission line by using the capture memories 54a to 54x. The captured data is stored as binary information of "0" and "1" into the registers 56a to 56x of the transmission lines.

Referring again to FIG. 5, there is a point at which the data switches from "0" to "1" in each of the registers 56a to 56x. The data switching position indicates time when the driver waveform of the corresponding transmission line changes from "L" to "H". In each of the transmission lines, in the register 56a, data is switched from the ninth data to the tenth data due to a skew between pins. In the register 56b, the data switch occurs between the seventh data and the eighth data. A difference between data positions at which the switching occurs corresponds to a skew between pins.

Referring again to FIG. 9, in following step S3, delay amount data corresponding to each of pins which is held by the propagation delay time data storing circuit 56 is outputted to the tester via the storage result outputting circuit 58.

In step S4, the delay amount determining unit 90 in FIG. 7 determines a delay amount corresponding to the read delay amount data. In step S5, the delay amount is set for the variable delay circuits 84 and 94. The preparation for the test is thus completed. After that, a normal test of the semiconductor device is conducted.

Since the delay amount set for the variable delay circuits is peculiar to the test jig, it is unnecessary to set the delay amount each time the semiconductor device is measured. For example, it is sufficient to set the delay amount each time the test jig is replaced or every predetermined time, for example, every other day.

As described above, by using the semiconductor device of the invention, the information of the delay amount corresponding to each of the transmission lines is held in the register provided in the semiconductor device. By adjusting the timing of the driver waveform on the basis of the information, the propagation delay time of the pins can be set to the same. The data in the register can be generally read by the comparator provided in the test via the storage result outputting circuit 58. It is therefore unnecessary to add a special device to the tester.

By adjusting the variable delay circuit built in the tester after the data is read by the tester, adjustment is performed so that transition points of waveforms of the drivers coincide with each other. After the adjustment, the driver waveforms applied from the tester are adjusted with high accuracy among the transmission lines.

Although the trigger is generated every predetermined interval of the reference signals, for example, every 10 pulses in the embodiment, if the performance of the tester permits, it is also possible to capture the driver waveform every pulse. The sampling time interval of the waveforms after the capture can be narrowed by thinning and capturing the driver waveforms at the interval of generating the trigger pulses of about 40 ns as compared with the capturing the driver waveforms in a real time manner. Consequently, in the case of using the tester of the same performance, the timing can be adjusted with higher accuracy.

By providing the timing adjusting circuit in a semiconductor device produced, it is unnecessary to form a device dedicated to correct the timing. The timing correction can be immediately performed as necessary even during the production.

Second Embodiment

Figure 13:
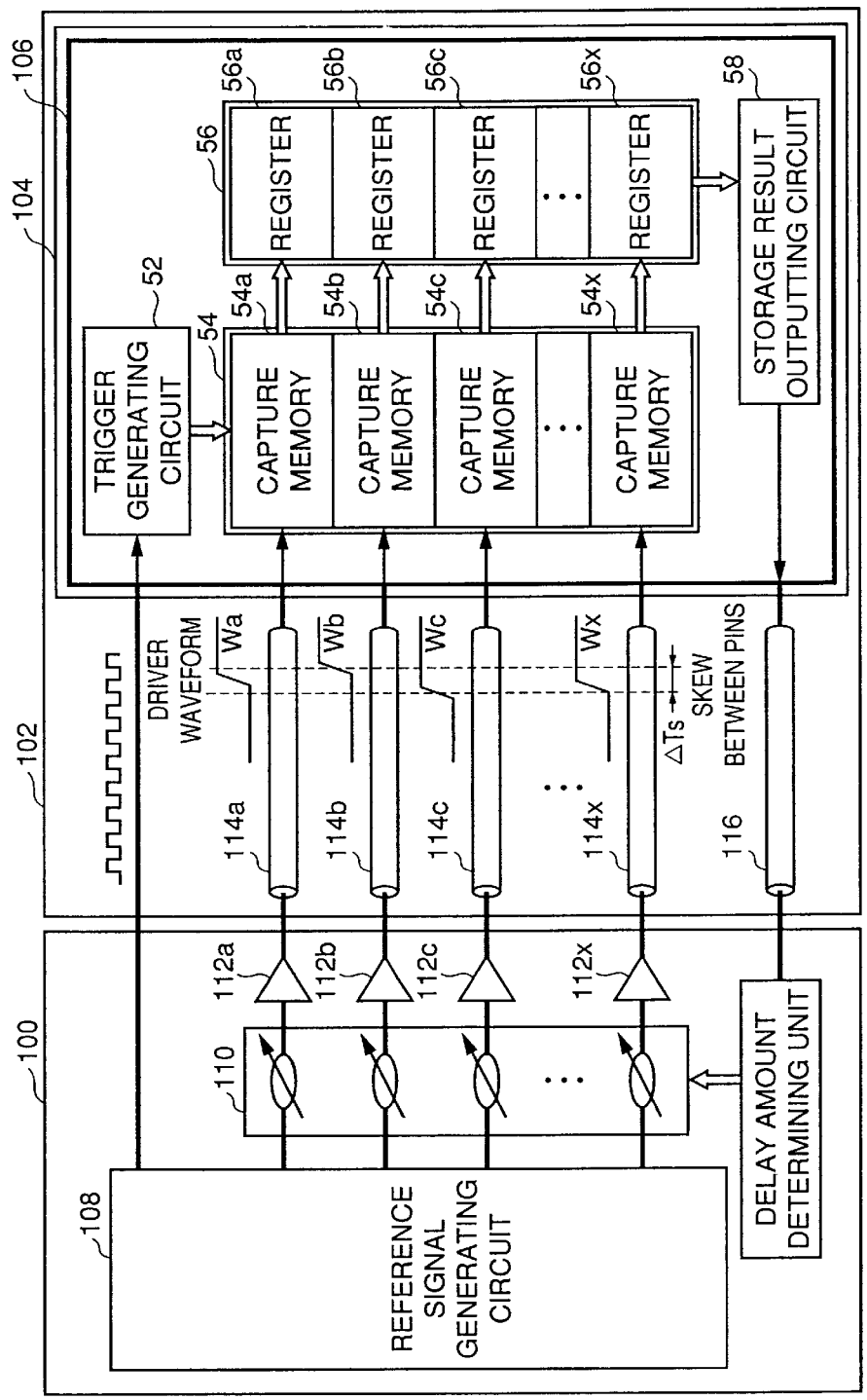
FIG. 13 is a block diagram for explaining the configuration of a semiconductor device 106 according to a second embodiment of the invention.
Figure 14:
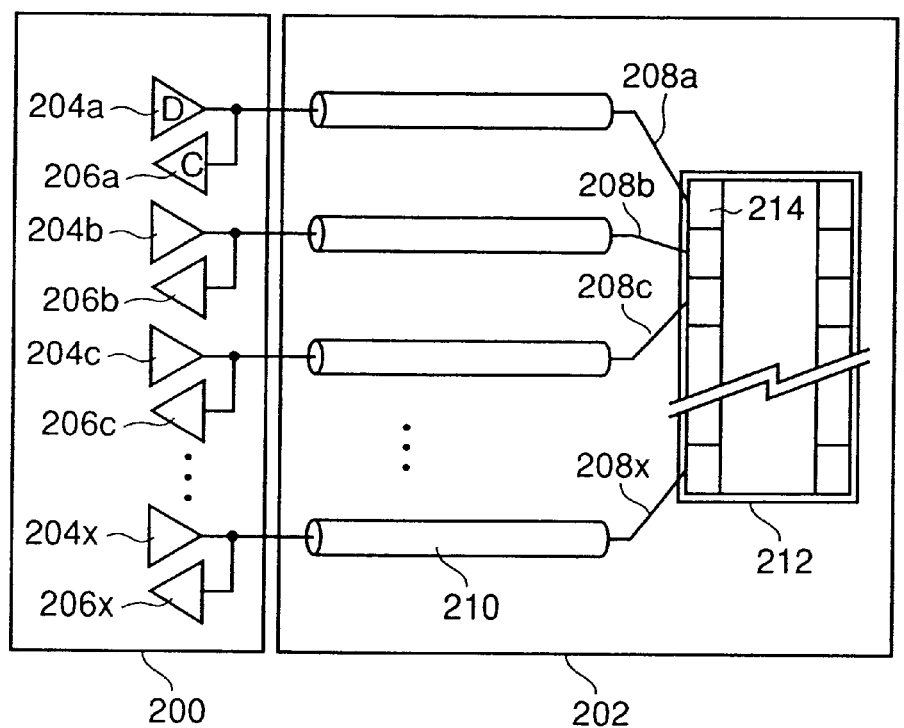
FIG. 14 is a diagram for explaining a test jig.
Figure 15:
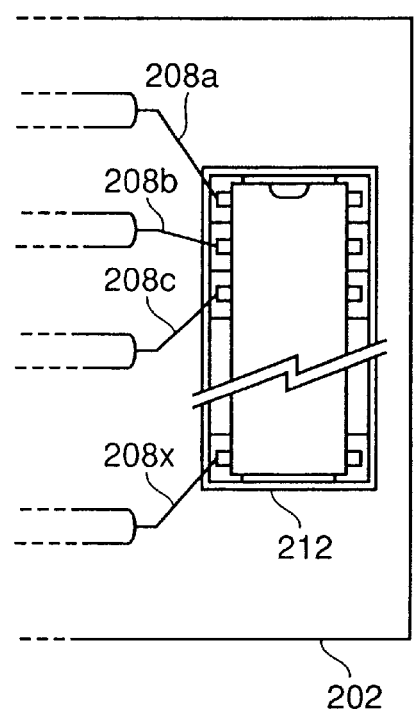
FIG. 15 is a diagram showing a state where a semiconductor device is attached to a socket of the test jig.
Figure 16:
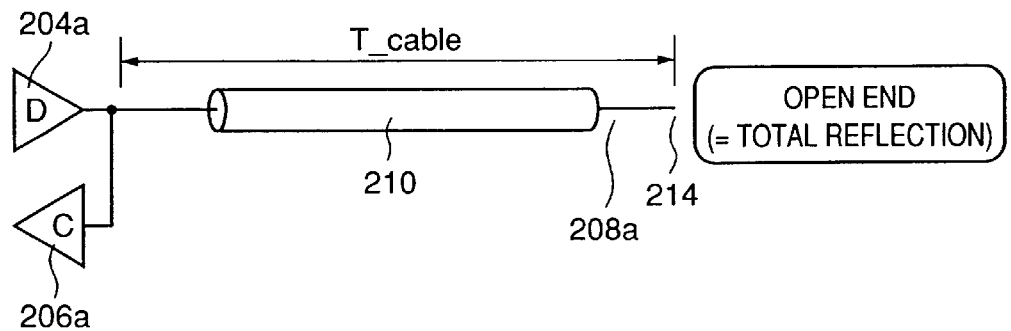
FIG. 16 is a diagram for explaining measurement of propagation delay time by a TDR method.
Figure 17:
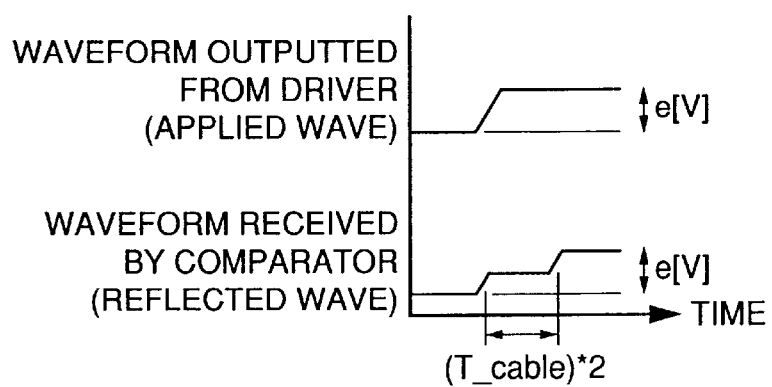
FIG. 17 is a waveform chart at the time of measuring propagation delay time by the TDR method.
Figure 18:
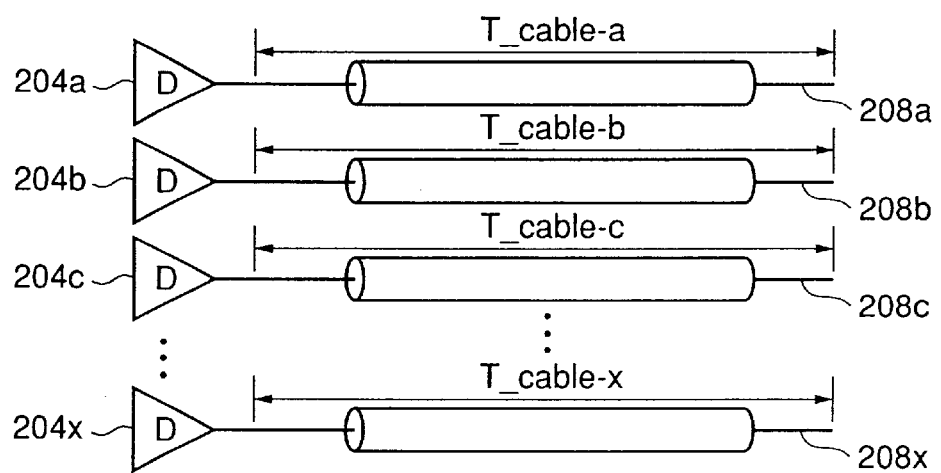
FIG. 18 is a diagram showing correspondence between the transmission lines on the test jig and propagation delay time.
Figure 19:
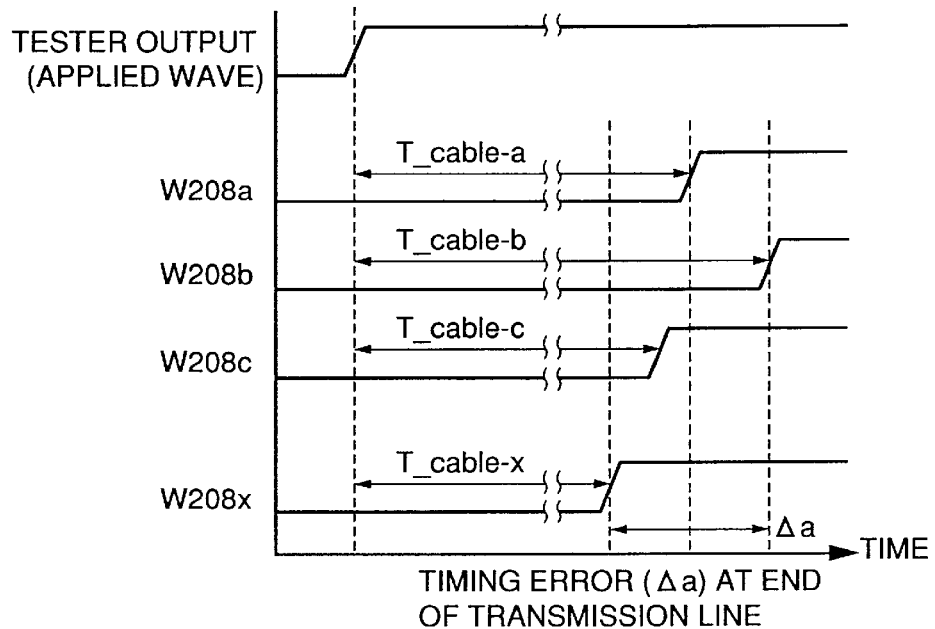
FIG. 19 is a waveform chart showing a state where waveforms outputted from the tester propagate to output terminals of the transmission lines.
Figure 20:
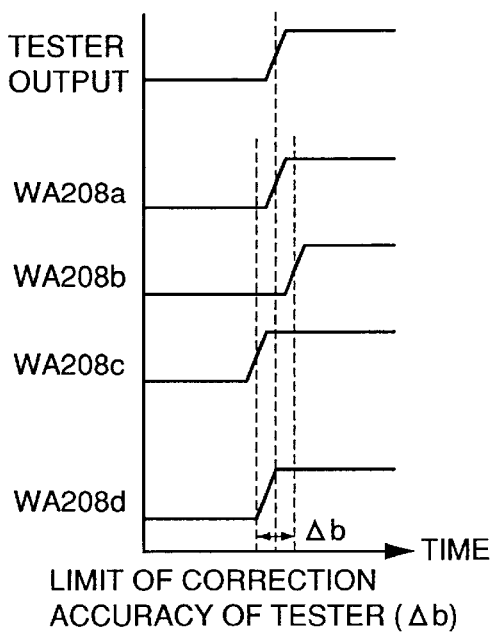
FIG. 20 is a waveform chart showing waveforms at output terminals after correction by the tester.

FIG. 13 is a block diagram for explaining the configuration of a semiconductor device 106 according to a second embodiment of the invention.

Referring to FIG. 13, the semiconductor device 106 is used by being attached to a socket 104 provided on a test jig 102. The test jig 102 is provided to electrically connect the tester 100 and the semiconductor device 106. The tester 100 includes: a reference signal generating circuit 108 for generating a reference signal; a variable delay circuit 110 capable of adjusting a delay amount of each pin; drivers 112a to 112x for outputting waveforms to the semiconductor device in accordance with an output of the variable delay circuit 110; and a delay amount determining unit which receives delay amount data of each pin and outputting the delay amount data to the variable delay circuit 110.

The test jig 102 includes transmission lines 114a to 114x corresponding to terminals of the semiconductor device; and a transmission line 116 for transmitting the delay amount data from the semiconductor device to the tester.

The semiconductor device 106 is enclosed in a package corresponding to the socket 104 attached to the test jig 102. The internal circuit configuration is similar to that of the timing adjusting circuit 26 shown in FIG. 2 and its description is not repeated here.

Specifically, by performing the timing adjustment using the semiconductor device for test obtained by enclosing only the timing adjusting circuit portion in a package of the same shape as that of the semiconductor device measured by the test jig 102 at the time of a normal production, effects similar to those of the first embodiment can be produced.

In this case, before starting the test of the semiconductor device as a normal product by attaching the test jig 102 to the tester 100, it is sufficient to attach the semiconductor device 106 to the socket 104, measure delay amount data of each pin, feed back the data to the tester 100 and, after that, start measuring the semiconductor device of a normal product.

Although the present invention has been described and illustrated in detail, it is clearly understood that the same is by way of illustration and example only is not to be taken by way of limitation, the spirit and scope of the present invention being limited only by the terms of the appended claims.

What is claimed is:

1. A semiconductor device comprising:
   a reference terminal for receiving a reference signal;
   a plurality of terminals;
   a capturing circuit for capturing an input signal supplied to said plurality of terminals in accordance with said reference signal and temporarily holding the input signal;

a data holding circuit for receiving the data held by said capturing circuit and holding data of an amount corresponding to a predetermined number of capturing times; and an output circuit for outputting the data held by said data holding circuit to the outside.

2. The semiconductor device according to claim 1, further comprising:

an internal circuit for receiving/transmitting data from/to said plurality of terminals in a regular mode; and a switching circuit for connecting said plurality of terminals to said internal circuit in the regular mode and connecting said plurality of terminals to said capturing circuit in a test mode.

3. The semiconductor device according to claim 2, wherein said internal circuit is a memory circuit for transmitting and receiving data via at least a part of said plurality of terminals.

4. The semiconductor device according to claim 1, further comprising a trigger generating circuit for dividing said reference signal and outputting a trigger signal instructing a timing at which said capturing circuit captures said input signal.

5. The semiconductor device according to claim 1, wherein said capturing circuit includes a plurality of data capturing units corresponding to said plurality of terminals, and said data holding circuit includes a plurality of registers for receiving outputs of said plurality of data capturing units and holding digital information of an amount corresponding to said predetermined number of times.

6. The semiconductor device according to claim 5, wherein each of said data capturing units includes:

a comparing circuit for comparing an input signal supplied to each of said terminals with reference potential to thereby convert the input signal into binary data; and a flip flop for capturing an output of said comparing circuit in accordance with said reference signal.

7. The semiconductor device according to claim 5, wherein each of said registers includes a plurality of flip flops which are connected in series and hold data in accordance with said reference signal.

8. A semiconductor device testing method of testing a semiconductor device by a tester via a test jig, comprising the steps of:

attaching a semiconductor device to said test jig, the semiconductor device having a reference terminal for receiving a reference signal, a plurality of terminals, and a data holding circuit for holding data corresponding to a time difference between said reference signal and an input signal supplied to said plurality of terminals;

supplying said reference signal and said input signal from said tester and allowing said data holding circuit to hold delay amount data of each of a plurality of signal transmission lines of the test jig corresponding to said plurality of terminals;

reading said delay amount data by said tester via said test jig; and correcting a timing of a signal which is outputted to said plurality of terminals by said tester in accordance with said delay amount data.

9. The semiconductor device testing method according to claim 8, further comprising the step of correcting a timing of determining a signal received from said plurality of terminals by said tester in accordance with said delay amount data.

10. The semiconductor device testing method according to claim 8, wherein said delay amount data is obtained by repeatedly supplying said reference signal and said input signal to said semiconductor device while shifting a phase of said input signal by a predetermined amount with respect to said reference signal.

* * * * *